United States Patent
Novak

[19]

[11] Patent Number: 6,104,258
[45] Date of Patent: Aug. 15, 2000

[54] SYSTEM AND METHOD FOR EDGE TERMINATION OF PARALLEL CONDUCTIVE PLANES IN AN ELECTRICAL INTERCONNECTING APPARATUS

[75] Inventor: Istvan Novak, Sudbury, Mass.

[73] Assignee: Sun Microsystems, Inc., Palo Alto, Calif.

[21] Appl. No.: 09/081,372

[22] Filed: May 19, 1998

[51] Int. Cl.[7] ............................................. H01P 1/26
[52] U.S. Cl. ........................................ 333/22 R; 333/81 A
[58] Field of Search ............................... 333/22 R, 81 A, 333/12, 246

[56] References Cited

U.S. PATENT DOCUMENTS

| | | | |
|---|---|---|---|
| 3,209,284 | 9/1965 | Hast | 333/22 R X |
| 3,678,417 | 7/1972 | Rogan et al. | 332/22 R |
| 4,626,889 | 12/1986 | Yamamoto et al. | 333/22 R X |
| 5,266,036 | 11/1993 | Lichtenwalter et al. | 439/65 |
| 5,523,727 | 6/1996 | Shingyoji | 333/22 R |
| 5,670,917 | 9/1997 | Mazzochete | 333/222 R |
| 5,708,400 | 1/1998 | Morris | 333/12 |

FOREIGN PATENT DOCUMENTS

| | | | |
|---|---|---|---|
| 5055813 | 3/1993 | Japan | 333/22 R |
| 5145306 | 6/1993 | Japan | 333/22 R |
| 5335812 | 12/1993 | Japan | 333/22 R |
| 433898 | 10/1982 | U.S.S.R. | 333/22 R |

*Primary Examiner*—Benny Lee
*Attorney, Agent, or Firm*—Conley, Rose & Tayon, PC; B. Noel Kivlin

[57] ABSTRACT

A system and method are presented for stabilizing the electrical impedance of an electrical interconnecting apparatus including a pair of parallel planar conductors separated by a dielectric layer. The electrical interconnecting apparatus may be, for example, a PCB, a component of a semiconductor device package, or formed upon a surface of an integrated circuit substrate. The present method includes determining a characteristic impedance of the structure. An electrical resistance is electrically coupled between regions of the planar conductors near peripheries, wherein the electrical resistance has a value dependent upon the characteristic impedance of the structure. The electrical resistance may be a set of discrete electrical resistances (e.g., resistors) dispersed about regions near peripheries of the planar conductors, or a continuous "stripe" of electrical resistance between the regions. The electrical resistance serves to stabilize the electrical impedance of the pair of parallel planar conductors, thereby reducing an amount of electromagnetic energy radiated from the structure.

27 Claims, 8 Drawing Sheets

1

SYSTEM AND METHOD FOR EDGE TERMINATION OF PARALLEL CONDUCTIVE PLANES IN AN ELECTRICAL INTERCONNECTING APPARATUS

BACKGROUND OF THE INVENTION

1. Field of the Invention

This invention relates to electronic systems, and more particularly to electrical interconnecting apparatus having continuous planar conductors.

2. Description of the Related Art

Electronic systems typically employ several different types of electrical interconnecting apparatus having planar layers of electrically conductive material (i.e., planar conductors) separated by dielectric layers. A portion of the conductive layers may be patterned to form electrically conductive signal lines or "traces". Conductive traces in different layers (i.e., on different levels) are typically connected using contact structures formed in openings in the dielectric layers (i.e., vias). For example, integrated circuits typically have several layers of conductive traces which interconnect electronic devices formed upon and within a semiconductor substrate. Each layer is separated from adjacent layers by dielectric layers. Within a semiconductor device package, several layers of conductive traces separated by dielectric layers may be used to electrically connect bonding pads of an integrated circuit to terminals (e.g., pins or leads) of the device package. Printed circuit boards also typically have several layers of conductive traces separated by dielectric layers. The conductive traces are used to electrically interconnect terminals of electronic devices mounted upon the PCB.

Signals in digital electronic systems typically carry information by alternating between two voltage levels (i.e., a low voltage level and a high voltage level). A digital signal cannot transition instantaneously from the low voltage level to the high voltage level, or vice versa. The finite amount of time during which a digital signal transitions from the low voltage level to the high voltage level is called the rise time of the signal. Similarly, the finite amount of time during which a digital signal transitions from the high voltage level to the low voltage level is called the fall time of the signal.

Digital electronic systems are continually being produced which operate at higher signal frequencies (i.e., higher speeds). In order for the digital signals within such systems to remain stable for appreciable periods of time between transitions, the rise and fall times of the signals must decrease as signal frequencies increase. This decrease in signal transition times (i.e., rise and fall times) creates several problems within digital electronic systems, including signal degradation due to reflections, power supply "droop", ground "bounce", and increased electromagnetic emissions.

A signal driven upon (i.e., launched) from a source end of a conductive trace suffers degradation when a portion of the signal reflected from a load end of the trace arrives at the source end after the transition is complete (i.e., after the rise time or fall time of the signal). A portion of the signal is reflected back from the load end of the trace when the input impedance of the load does not match the characteristic impedance of the trace. When the length of a conductive trace is greater than the signal transition time (i.e., the rise or fall time) divided by about 20 times the delay per unit length along the trace, the effects of reflections upon signal integrity (i.e., transmission line effects) should be considered. If necessary, steps should be taken to minimize the degradations of signals conveyed upon the trace due to reflections. The act of altering impedances at the source or load ends of the trace in order to reduce signal reflections is referred to as "terminating" the trace. For example, the input impedance of the load may be altered to match the characteristic impedance of the trace in order to prevent signal reflection. As the transition time (i.e., the rise or fall time) of the signal decreases, so does the length of trace which must be terminated in order to reduce signal degradation.

A digital signal alternating between the high and low voltage levels includes contributions from a fundamental sinusoidal frequency (i.e., a first harmonic) and integer multiples of the first harmonic. As the rise and fall times of a digital signal decrease, the magnitudes of a greater number of the integer multiples of the first harmonic become significant. As a general rule, the frequency content of a digital signal extends to a frequency equal to the reciprocal of $\pi$ times the transition time (i.e., rise or fall time) of the signal. For example, a digital signal with a 1 nanosecond transition time has a frequency content extending up to about 318 MHz.

All conductors have a certain amount of inductance. The voltage across the inductance of a conductor is directly proportional to the rate of change of current through the conductor. At the high frequencies present in conductors carrying digital signals having short transition times, a significant voltage drop occurs across a conductor having even a small inductance. A power supply conductor connects one terminal of an electrical power supply to a power supply terminal of a device, and a ground conductor connects a ground terminal of the power supply to a ground terminal of the device. When the device generates a digital signal having short transition times, high frequency transient load currents flow in the power supply and ground conductors. Power supply droop is the term used to describe the decrease in voltage at the power supply terminal of the device due to the flow of transient load current through the inductance of the power supply conductor. Similarly, ground bounce is the term used to describe the increase in voltage at the ground terminal of the device due to the flow of transient load current through the inductance of the ground conductor. When the device generates several digital signals having short transition times simultaneously, the power supply droop and ground bounce effects are additive. Sufficient power supply droop and ground bounce can cause the device to fail to function correctly.

Power supply droop is commonly reduced by arranging power supply conductors to form a crisscross network of intersecting power supply conductors (i.e., a power supply grid). Such a grid network has a lower inductance, hence power supply droop is reduced. A continuous power supply plane may also be provided which has an even lower inductance than a grid network. Placing a "bypass" capacitor near the power supply terminal of the device is also used to reduce power supply droop. The bypass capacitor supplies a substantial amount of the transient load current, thereby reducing the amount of transient load current flowing through the power supply conductor. Ground bounce is reduced by using a low inductance ground conductor grid network, or a continuous ground plane having an even lower amount of inductance. Power supply and ground grids or planes are commonly placed in close proximity to one another in order to further reduce the inductances of the grids or planes.

Electromagnetic interference (EMI) is the term used to describe unwanted interference energies either conducted as currents or radiated as electromagnetic fields. High frequency components present within circuits producing digital signals having short transition times may be coupled into nearby electronic systems (e.g., radio and television circuits), disrupting proper operation of these systems. The United States Federal Communication Commission has established upper limits for the amounts of EMI products for sale in the United States may generate.

Signal circuits form current loops which radiate magnetic fields in a differential mode. Differential mode EMI is usually reduced by reducing the areas proscribed by the circuits and the magnitudes of the signal currents. Impedances of power and ground conductors create voltage drops along the conductors, causing the conductors to radiate electric fields in a common mode. Common mode EMI is typically reduced by reducing the impedances of the power and ground conductors. Reducing the impedances of the power and ground conductors thus reduces EMI as well as power supply droop and ground bounce.

Within the wide frequency range present within electronic systems with digital signals having short transition times, the electrical impedance between any two parallel conductive planes (e.g., adjacent power and ground planes) may vary widely. The parallel conductive planes may exhibit multiple electrical resonances, resulting in alternating high and low impedance values. Parallel conductive planes tend to radiate a significant amount of differential mode EMI at their boundaries (i.e., from their edges). The magnitude of differential mode EMI radiated from the edges of the parallel conductive planes varies with frequency and is directly proportional to the electrical impedance between the planes.

FIGS. 1 and 2 will now be used to illustrate the problematic variation with frequency of the electrical impedance between parallel conductive planes. FIG. 1 is a perspective view of a pair of 10 in.×10 in. square conductive planes separated by a fiberglass-epoxy composite dielectric layer. Each conductive plane is made of copper and is 0.0014 in. thick. The fiberglass-epoxy composite layer separating the planes has a dielectric constant of 4.0 and is 0.004 in. thick (i.e. has a heighth of 0.004 in.). FIG. 2 is a graph of the logarithm of the simulated electrical impedance 2 between the pair of rectangular conductive planes of FIG. 1 versus the logarithm of the frequency of a voltage between the planes. The graph was created by modeling each square inch of the pair of conductive planes as a matrix of transmission lines. The impedance value was computed by simulating the application of a 1 ampere constant current between the centers of the rectangular planes, varying the frequency of the current, and determining the magnitude of the steady state voltage between the centers of the rectangular planes.

As shown in FIG. 2, the electrical impedance between the parallel conductive planes of FIG. 1 varies widely at frequencies above about 20 MHz. The parallel conductive planes exhibit multiple electrical resonances at frequencies between 100 MHz and 1 GHz, resulting in alternating high and low impedance values. The parallel conductive planes of FIG. 1 would radiate substantial amounts of EMI at frequencies where the electrical impedance between the planes anywhere near their peripheries is high.

It would thus be desirable to have a system for stabilizing the electrical impedance between parallel conductive planes. Such a system would reduce power supply droop, ground bounce, and the amount of electromagnetic energy radiated from the edges of the planes. Such impedance stabilization may also reduce the need for bypass capacitors.

SUMMARY OF THE INVENTION

The problems outlined above are in large part solved by a system and method for stabilizing the electrical impedance of an electrical interconnecting apparatus including a pair of parallel planar conductors separated by a dielectric layer. The electrical interconnecting apparatus may be, for example, a PCB, a semiconductor device package substrate, or an integrated circuit substrate. The present method includes determining a characteristic impedance of the structure. An electrical resistance is then electrically coupled between the planar conductors, wherein the electrical resistance has a value dependent upon the characteristic impedance of the structure. The electrical resistance may be a set of discrete electrical resistances (e.g., resistors) dispersed between regions of the planar conductors near the peripheries, or a continuous "stripe" of electrical resistance between the regions near peripheries.

When the electrical resistance is a set of discrete electrical resistances, the method may include selecting a value for each of the set of electrical resistances and electrically coupling each of the electrical resistances between the regions near the peripheries such that a lateral spacing distance is maintained between the electrical resistances. When the structure is square, the characteristic impedance of the entire structure may be determined, and the spacing distance between the electrical resistances may be computed. The characteristic impedance of the structure may then be multiplied by the ratio of the length of the sides of the structure to the spacing distance, resulting in the value for each of the set of electrical resistances.

The characteristic impedance "Zo" of a pair of square planar conductors in parallel and separated by a dielectric layer may be approximated using:

$$Z_o = Z_{oo}\left(\frac{h}{w\sqrt{\varepsilon_r}}\right)$$

where Zoo is the impedance of free space (120 π ohms), h is the distance between the planar conductors, w is the length of each of the sides of the composite structure, and $\varepsilon_r$, is the relative dielectric constant of the dielectric layer. The above equation for Zo is a low frequency approximation as it is derived using the low frequency (i.e. "static") capacitance between the planar conductors. In the above equation, the characteristic impedance of the planar conductors is thus directly proportional to the distance between the planar conductors and inversely proportional to the lengths of the sides of the composite structure and the square root of the relative dielectric constant of the dielectric layer.

The spacing distance between the electrical resistances may be determined by the wavelength of the highest frequency in a frequency range of interest. For example, the interconnecting apparatus may include a signal layer having electrically conductive traces for conveying signals. The signals have an associated frequency range (i.e., the frequency range of interest). As described above, the frequency content of a digital signal may extend to a frequency equal to the reciprocal of π times the transition time (i.e., rise or fall time) of the signal. The spacing distance between the electrical resistances is preferably made equal to a fraction of the wavelength of the highest frequency in the frequency range of interest. For example, the spacing distance between the electrical resistances may be less than or equal to one tenth of the wavelength of the highest frequency in the frequency range of interest.

When the structure is rectangular but not square, the spacing distance between the electrical resistances may first be determined. The characteristic impedance of a square portion of the structure having sides with lengths equal to the spacing distance may then be computed. The characteristic impedance of the square portion of the structure is the value for each of the set of electrical resistances.

When the electrical resistance is continuous between the regions of the planar conductors near the peripheries, and the structure is rectangular, the characteristic impedance of the entire structure may be determined. A resistive "stripe" along a given side of the structure between the regions near the peripheries should provide a resistance per unit length equal to the characteristic impedance of the structure divided by the length of the side. Accordingly, the resistive stripe provides a total resistance along each side of the structure equal to the characteristic impedance of the structure.

An electrical interconnecting apparatus in accordance with the present invention includes an electrical resistance electrically coupled between regions of the planar conductors near peripheries. The electrical resistance has a value dependent upon a characteristic impedance of the planar conductors, and serves to stabilize the electrical impedance of the pair of parallel planar conductors. The electrical resistance may be a set of discrete electrical resistances (e.g., resistors) dispersed between the outer regions. Alternately, the electrical resistance may be a continuous "stripe" of electrical resistance between the outer regions.

In one embodiment, the electrical interconnecting apparatus includes multiple impedance networks dispersed about a region near a periphery of an upper surface of the electrical interconnecting apparatus. The impedance networks are separated by a predetermined spacing distance. A pair of vias is used to electrically connect each impedance network between regions of the planar conductors near peripheries. Each impedance network includes an electrical resistance (e.g., a resistor) having a selected value dependent upon the characteristic impedance of the planar conductors. Each impedance network may also include an electrical capacitance (e.g., a capacitor) in series with the electrical resistance. When the planar conductors are maintained at different direct current (d.c.) potentials, the capacitance prevents a flow of d.c. current between the planar conductors through the impedance networks. The spacing distance between the impedance networks may be determined by the wavelength of the highest frequency in a frequency range of interest as described above.

The electrical interconnecting apparatus may be, for example, substantially rectangular. In this case, a subset of the impedance networks may reside within a region near a periphery of an upper surface of one side of the electrical interconnecting apparatus. The sum of the electrical resistances of the subset of impedance networks may be made substantially equal to the characteristic impedance of the planar conductors. Members of the subset may be connected together to form a chain of impedance networks.

When each impedance network may includes an electrical capacitance C in series with electrical resistance R, the value of C is preferably determined using the following equation:

$$C > \frac{1}{2\pi \cdot R \cdot f_{res}}$$

where $f_{res}$ is the lowest resonant frequency of the structure including the planar conductors separated by the dielectric layer. Thus the value of C is preferably inversely related to the value of R. Resonant frequency $f_{res}$ may be determined experimentally or by computer simulation. In FIG. 2, $f_{res}$ is the frequency where the impedance is minimum, approximately 100 MHz.

In an alternate embodiment of the electrical interconnecting apparatus, a series combination of resistance and capacitance formed between a pair of planar conductors is continuous about the regions near the peripheries of the planar conductors. An electrically resistive layer is positioned between the dielectric layer and one of the planar conductors such that the electrically resistive layer is in contact with the planar conductor. The dielectric layer includes an inner portion and an outer portion, wherein the outer portion is located between the regions near the peripheries of the planar conductors. The dielectric constant of the outer portion of the dielectric layer is greater than the dielectric constant of the inner portion of the dielectric layer. The portion of the electrically resistive layer located between the outer portion of the dielectric layer and the adjacent planar conductor provides an electrical resistance directly proportional to the characteristic impedance of the planar conductors.

The outer portion of the dielectric layer provides an electrical capacitance in series with the resistance. The capacitance per unit length $C_l$ provided by the outer portion of the dielectric layer is preferably dependent upon the resistance per unit length $R_l$ provided by the resistive layer according to the following equation:

$$C_l > \frac{1}{2\pi \cdot R_l \cdot f_{res}}$$

where $f_{res}$ is the lowest resonant frequency of the structure including the planar conductors separated by the dielectric layer. Thus the value of $C_l$ is preferably inversely related to the value of $R_l$.

BRIEF DESCRIPTION OF THE DRAWINGS

Other objects and advantages of the invention will become apparent upon reading the following detailed description and upon reference to the accompanying drawings in which.

Figure 1:
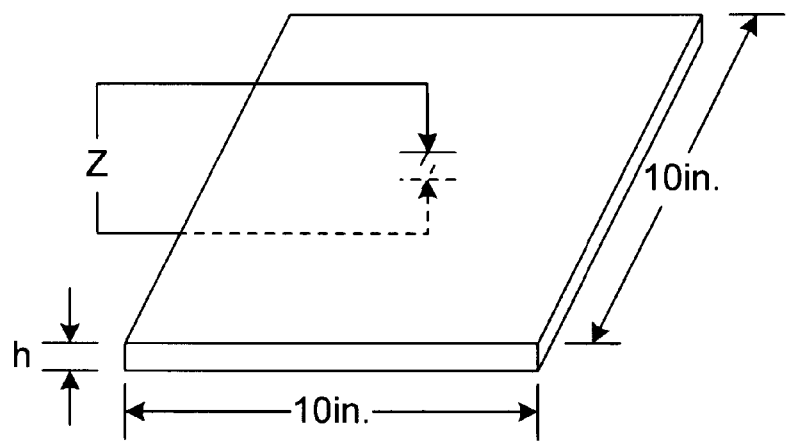
FIG. 1 is a perspective view of a pair of 10 in.×10 in. square conductive planes separated by a fiberglass-epoxy composite dielectric layer.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 3:
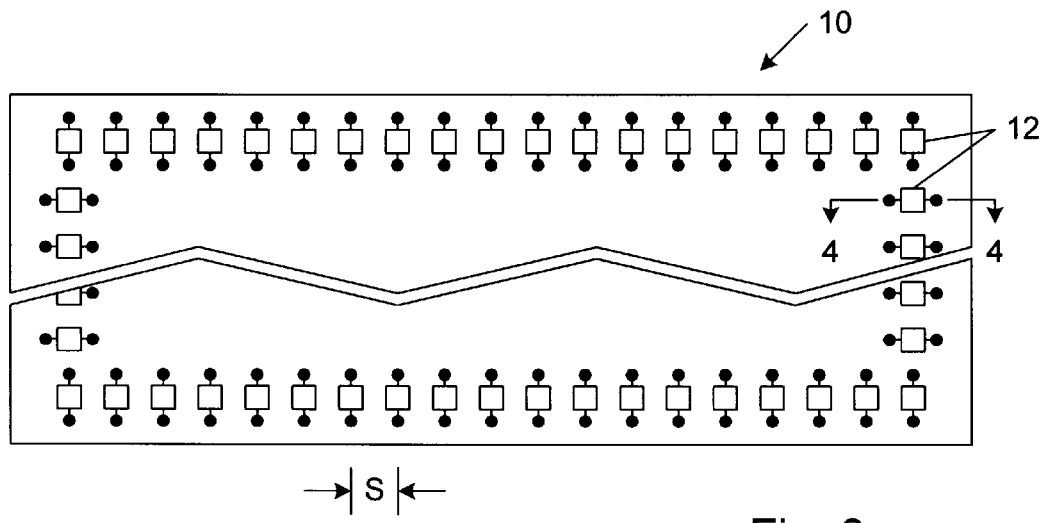
FIG. 3 is a top plan view of one embodiment of an electrical interconnecting apparatus in accordance with the present invention, wherein the interconnecting apparatus includes multiple impedance networks dispersed within a region near a periphery (i.e., an outer edge) of an upper surface.

FIG. 3 is a top plan view of one embodiment of an electrical interconnecting apparatus 10 in accordance with the present invention. Interconnecting apparatus 10 includes multiple layers of planar electrical conductors separated by dielectric layers. At least one of the planar electrical conductors may be patterned to form signal lines (i.e., interconnects or traces). Interconnecting apparatus 10 may be, for example, a PCB, a component of a semiconductor device package, or formed upon a surface of an integrated circuit substrate.

Figure 4:
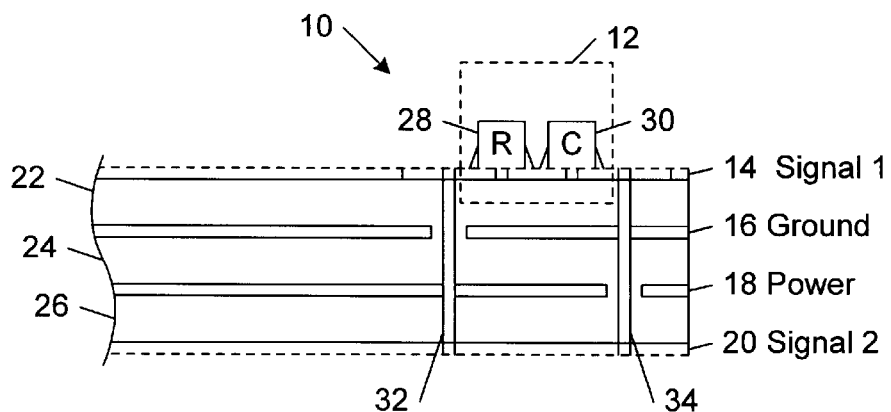
FIG. 4 is a cross sectional view of a portion the interconnecting apparatus of FIG. 3, illustrating the connection of one of the impedance networks between parallel power and ground planes within the interconnecting apparatus.

FIG. 4 is a cross sectional view of a portion interconnecting apparatus 10. In the embodiment of FIG. 4, interconnecting apparatus 10 includes four planar electrical conductors: a first signal plane 14, a ground plane 16, a power plane 18, and a second signal plane 20. During use of interconnecting apparatus 10, power plane 18 is connected to a power terminal of an electrical power supply, and ground plane 16 is connected to a ground terminal of the power supply. Electronic devices connected between power plane 18 and ground plane 16 receive electrical power. Power plane 18 and ground plane 16 are continuous across at least a portion of interconnecting apparatus 10. First signal plane 14 and second signal plane 20 are patterned to form electrically conductive traces as described above. First signal plane 14 and ground plane 16 are separated by a first dielectric layer 22. Ground plane 16 and power plane 18 are separated by a second dielectric layer 24. Power plane 18 and second signal plane 20 are separated by a third dielectric layer 26.

In the embodiment of FIG. 3, interconnecting apparatus 10 includes multiple impedance networks 12 dispersed about a region near a periphery (i.e., an outer edge) of an upper surface of interconnecting apparatus 10. As will be described in detail below, impedance networks 12 are separated by a selected spacing distance "s". FIG. 4 is a cross sectional view of a portion interconnecting apparatus 10 through an impedance network 12. In the embodiment of FIGS. 3 and 4, impedance networks 12 are electrically connected between regions near peripheries of power plane 18 and ground plane 16 by a pair of vertical electrical conductors (i.e., vias). Impedance networks 12 are used to stabilize the electrical impedance between power plane 18 and ground plane 16.

FIG. 4 depicts one embodiment of impedance network 12, wherein impedance network 12 includes an electrical resistance 28 connected in series with an electrical capacitance 30. Electrical resistance 28 may be, for example, a surface mount resistor. Similarly, electrical capacitance 30 may be, for example, a surface mount capacitor. A first via 32 connects power plane 18 to electrical resistance 28, and a second via 34 connects ground plane 16 to electrical capacitance 30. Vias 32 and 34 may be, for example, plated-through holes formed using various well known techniques.

During use of interconnect apparatus 10, the power supply provides a direct current (d.c.) electrical potential between power plane 18 and ground plane 16. Impedance networks 12 which ring the upper surface of interconnect apparatus 10 provide alternating current (a.c.) termination of the structure including power plane 18, ground plane 16, and second dielectric layer 24 separating power plane 18 and ground plane 16. Electrical switching occurring within electronic devices connected between power plane 18 and ground plane 16 creates a.c. waveforms within power plane 18 and ground plane 16. These a.c. waveforms "see" an impedance value substantially equal to all of the electrical resistances 28 of impedance networks 12 in parallel. At the same time, electrical capacitances 30 prevent d.c. current from flowing between power plane 18 and ground plane 16 through impedance networks 12.

Figure 5:
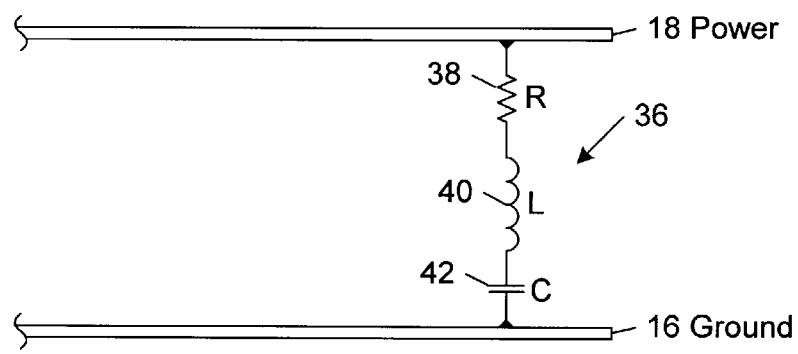
FIG. 5 is a circuit diagram showing an equivalent electrical network between the power and ground planes provided by the impedance network depicted in FIG. 4.

FIG. 5 is a circuit diagram showing an equivalent electrical network 36 between power plane 18 and ground plane 16 provided by the impedance network 12 depicted in FIG. 4. Electrical network 36 includes an electrical resistance (R) 38, an electrical inductance (L) 40, and an electrical capacitance (C) 42. The value of resistance 38 includes the value of resistance 28, the electrical resistances of vias 32 and 34, and the equivalent series resistance (ESR) of capacitance 42.

Inductance 40 includes the inductances of resistance 28, capacitance 30, via 32, and via 34. Capacitance 42 includes the value of capacitance 30.

As described above, impedance networks 12 are separated by a selected spacing distance s as shown in FIG. 3. Signals are conveyed within interconnect apparatus 10 (e.g., within a signal layer) and have an associated range of frequencies (i.e., a frequency range of interest). Spacing s between impedance networks 12 is preferably made equal to a fraction of the wavelength of the highest frequency in the frequency range of interest. Spacing s may be, for example, less than or equal to one tenth of the wavelength of the highest frequency in the frequency range of interest.

For example, signals conveyed within interconnect apparatus 10 may have a transition time (i.e., rise or fall time) of 1 nanosecond. In this case, the highest frequency in the frequency range of interest, "ƒm", may be the reciprocal of π times the transition time, or about 318 MHz. The wavelength of ƒm is the velocity divided by the frequency. If the dielectric layer separating power plane 18 and ground plane 16 has a relative dielectric constant of 4.7, the velocity is the speed of light "c" (about $3.0 \times 10^8$ m/sec) divided by the square root of the relative dielectric constant "$\epsilon_r$", or approximately $1.38 \times 10^8$ m/sec. The wavelength of ƒm is the velocity (about $1.38 \times 10^8$ m/sec) divided by the frequency (approximately 318 MHz), or about 43 cm. In this case, spacing s may be less than or equal to about 4.3 cm (approximately 1.7 in.). In terms of a mathematical equation, $$s \leq \frac{c}{10 f_m \sqrt{\varepsilon_r}}$$

Figure 6:
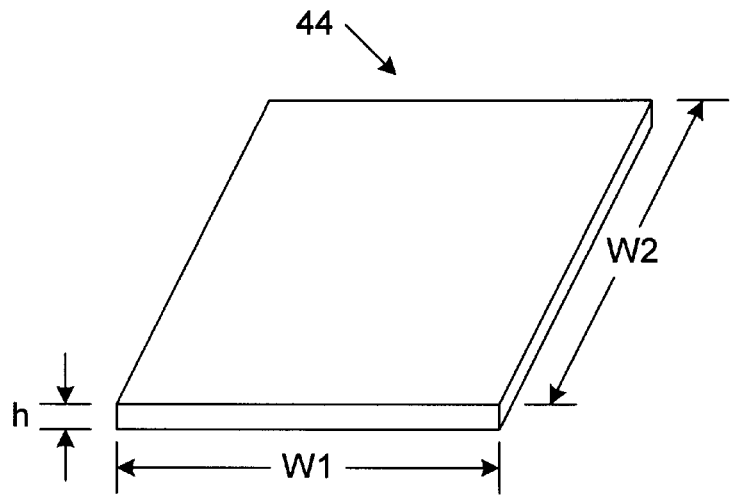
FIG. 6 is a perspective view of a rectangular structure including a pair of planar electrical conductors separated by a dielectric layer.
Figure 7:
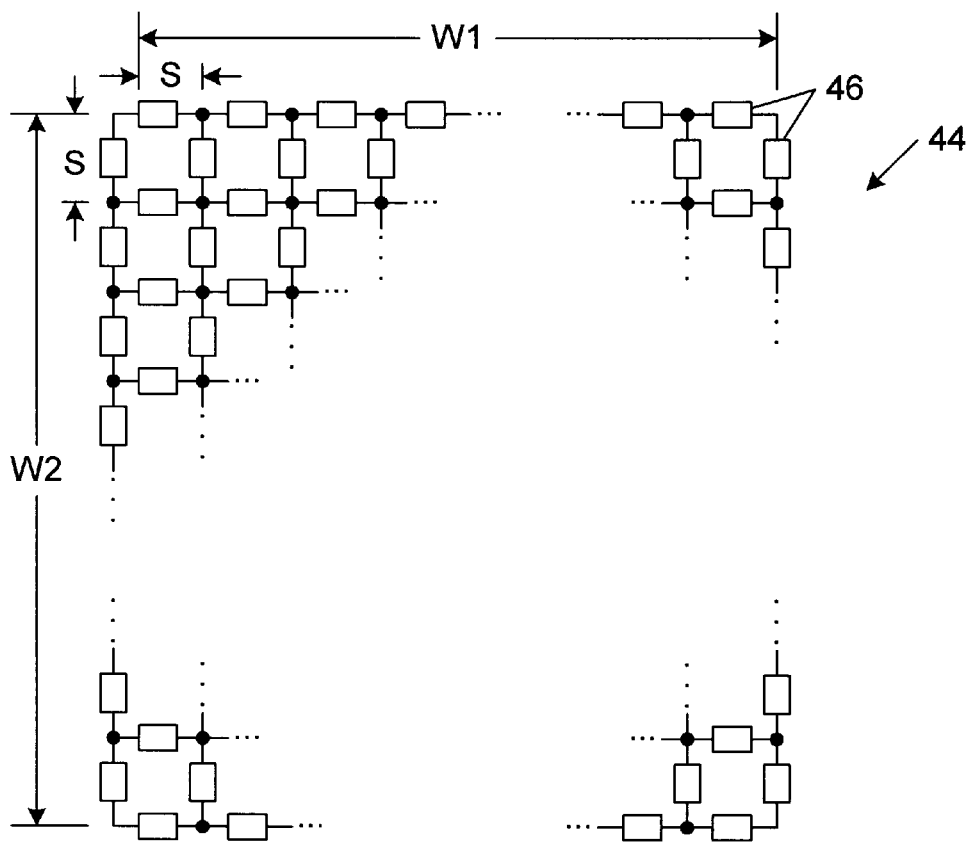
FIG. 7 is a block diagram illustrating how the structure of FIG. 6 is modeled as a two-dimensional network (i.e., grid) of ideal (i.e., lossless) transmission line segments.

FIG. 6 is a perspective view of a rectangular structure 44 including a pair of planar electrical conductors separated by a dielectric layer. The planar conductors have dimensions "w1" and "w2", and the dielectric layer has a thickness or height "h". As shown in FIG. 7, structure 44 of FIG. 6 modeled as a two-dimensional network (i.e., grid) of ideal (i.e., lossless) transmission line segments 46. Features of structure 44 appearing in FIG. 6 and described above are labeled similarly in FIG. 7. Two sets of parallel lines with equivalent spacings s are superimposed upon one another such that members of one set are perpendicular to members of the other set. Transmission line segments 46 are inserted between the intersections of these lines, and transmission line segments 46 are connected at the intersections. It is noted that while lossless transmission line segments 46 are described herein, "lossy" transmission line segments may be developed which account for resistive and skin losses in conductors and dielectric losses is dielectric layers.

The characteristics of ideal transmission lines are determined by two equations of two variables: the inductance "L" of the transmission line per unit length and the capacitance "C" of the transmission line per unit length. A first equation defines a characteristic impedance "Zo" of the transmission line:

$$Z_o = \sqrt{\frac{L}{C}}$$

The second equation defines the propagation delay "$t_{pd}$" of the transmission line per unit length:

$$t_{pd} = \sqrt{LC}$$

Parameters for each transmission line segment 46 are determined on a "unit cell" basis. The static (i.e., low frequency) capacitance of each square s-by-s unit cell "Cu" is given by:

$$C_u = \varepsilon_o \varepsilon_r \left( \frac{s^2}{h} \right)$$

when $\epsilon_o$ is the permittivity of free space.

The propagation delay along an edge of the unit cell "$t_{pd\_u}$" is determined by s, the speed of light c, and the relative dielectric constant $\epsilon_r$ of the dielectric layer separating the planar conductors:

$$t_{pd\_u} = \frac{s}{c} \sqrt{\varepsilon_r}$$

The values of $t_{pd\_u}$ and Cu are used to derive an approximate low frequency characteristic impedance "Zo_u" of each s-by-s square unit cell:

$$Z_{o\_u} = \frac{t_{pd\_u}}{C_u} = \left( \frac{s\sqrt{\varepsilon_r}}{c} \right) \left( \frac{h}{\varepsilon_o \varepsilon_r s^2} \right) = \frac{h}{c \varepsilon_o s \sqrt{\varepsilon_r}} = Z_{oo} \left( \frac{h}{s\sqrt{\varepsilon_r}} \right)$$

where Zoo is the impedance of free space, 120 π ohms.

Each square s-by-s unit cell is represented by four transmission line segments 46, one along each side of the unit cell. Each transmission line segment 46 has a characteristic impedance of 4·Zo_u. Transmission line segments 46 of adjacent unit cells are in parallel, resulting in equivalent characteristic impedances of 2·Zo_u. Thus transmission line segments 46 along borders between adjacent unit cells have characteristic impedances of 2·Zo_u, and transmission line segments 46 along outer edges of structure 44 have characteristic impedances of 4·Zo_u. All transmission line segments 46 have $t_{pd\_u}$ propagation delays.

When interconnect apparatus 10 is square, the values for electrical resistances 28 positioned along the edges of interconnect apparatus 10 may be selected by (i) computing the characteristic impedance of the structure including the planar conductors, (ii) determining spacing distance s, and (iii) multiplying the characteristic impedance of the structure by the ratio of the length of one side of the structure to spacing distance s. For example, assume interconnect apparatus 10 includes a pair of 10 in.×10 in. square planar conductors separated by a dielectric layer having a thickness or height h of 0.004 in. and a relative dielectric constant $\epsilon_r$ of 4.7. Digital signals are conveyed having transition times of 1 nanosecond. As described above, the highest frequency in the frequency range of interest ƒm may be the reciprocal of π times the transition time, or 318 MHz. Spacing s is thus preferably less than or equal to 1.7 in. In this case, select spacing s of 1.0 in. The characteristic impedance "Zo" of the structure including the planar conductors and the dielectric layer is calculated using:

$$Z_o = Z_{oo} \left( \frac{h}{w\sqrt{\varepsilon_r}} \right) = (120\pi) \left( \frac{0.004}{10\sqrt{4.7}} \right) = 0.070 \Omega$$

The ratio of the length of one side of the structure to spacing distance s is 10, thus each electrical resistance 28 should have a value of about 0.070 Ω·10=0.70 Ω.

When interconnect apparatus 10 is rectangular but not square, the values for electrical resistances 28 positioned along the edges of structure 44 may be selected by: (i) determining spacing distance s, and (ii) computing the characteristic impedance of each s-by-s unit cell. For example, assume structure 44 has dimensions of 8 in.×10 in., a dielectric layer having a thickness or height h of 0.031 in. and a relative dielectric constant $\epsilon_r$ of 4.7, and digital signals with transition times of 1 nanosecond are conveyed. As described above, the highest frequency in the frequency range of interest $f_m$ may be the reciprocal of $\pi$ times the transition time, or 318 MHz. Spacing s is thus preferably less than or equal to 1.7 in. As before, select spacing s of 1.0 in. Each square s-by-s unit cell has a characteristic impedance "Zo_u" given by:

$$Z_{o\_u} = Z_{oo}\left(\frac{h}{w\sqrt{\varepsilon_r}}\right) = (120\pi)\left(\frac{0.031}{1.0\sqrt{4.7}}\right) = 5.39\Omega$$

Each electrical resistance 28 should have a value of about 5.39 Ω.

Figure 2:
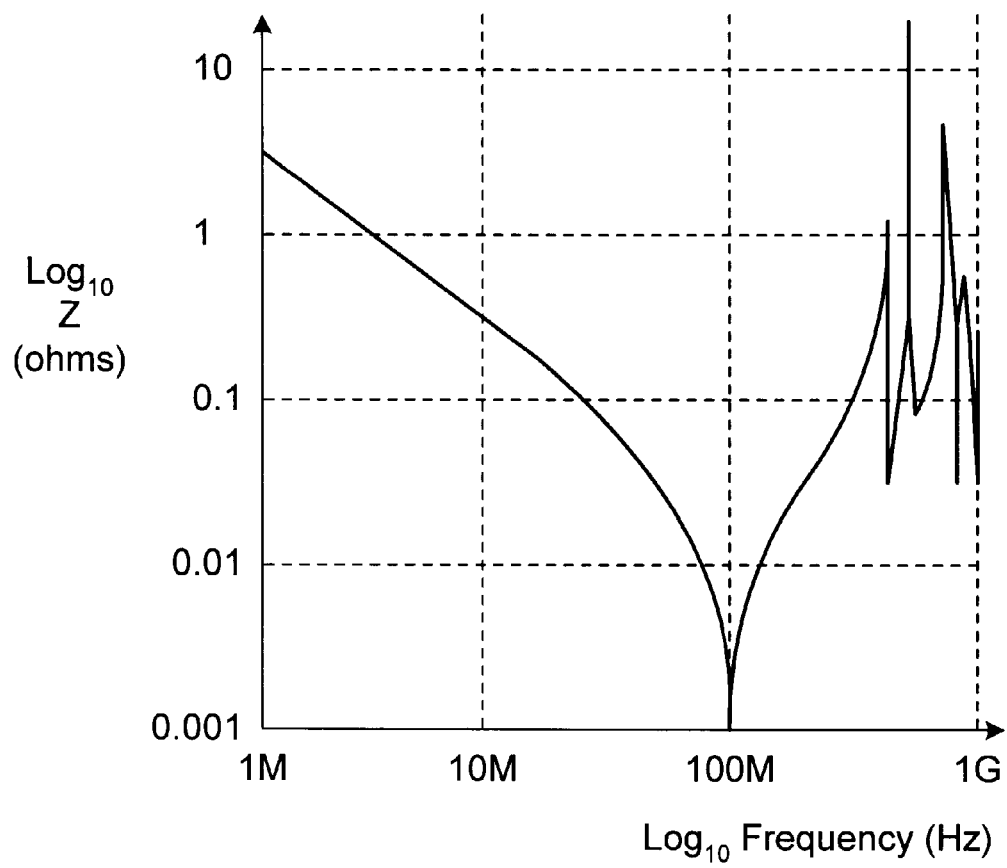
FIG. 2 is a graph of the logarithm of the simulated electrical impedance between the pair of rectangular conductive planes of FIG. 1 versus the logarithm of the frequency of a voltage between the planes.

The value for each electrical capacitance 30, denoted C, is preferably determined using the following equation:

$$C > \frac{1}{2\pi \cdot R \cdot f_{res}}$$

where R is the value of electrical resistance 28 and $f_{res}$ is the lowest resonant frequency of the structure including the planar conductors separated by the dielectric layer. Resonant frequency $f_{res}$ may be determined experimentally or by computer simulation. In FIG. 2, $f_{res}$ is the frequency where the impedance is minimum, approximately 100 MHz.

Figure 8:
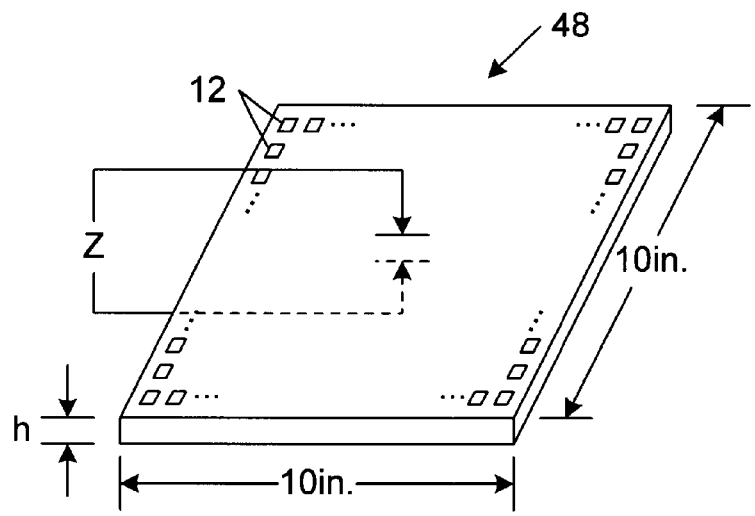
FIG. 8 is a perspective view of a structure including a pair of 10 in.×10 in. square conductive planes separated by a fiberglass-epoxy composite dielectric layer, wherein multiple impedance networks are dispersed within a region near the periphery of the upper surface of the structure and connected between the planes.

FIG. 8 is a perspective view of a structure 48 including a pair of 10 in.×10 in. square conductive planes separated by a fiberglass-epoxy composite dielectric layer. Each conductive plane is made of copper and is 0.0014 in. thick. The fiberglass-epoxy composite layer separating the planes has a dielectric constant of 4.0 and has a thickness or height h of 0.004 in. Multiple impedance networks 12 are dispersed about a region near the periphery of the upper surface of structure 48 as shown in FIG. 8 and separated by a spaced distance s of 1.0 in. Each impedance network 12 included an electrical resistance 28 in series with a capacitance 30 as described above. Each capacitance 30 was selected to be 1.0 microfarad.

The characteristic impedance "Zo" of the structure is calculated using:

$$Z_o = Z_{oo}\left(\frac{h}{w\sqrt{\varepsilon_r}}\right) = (120\pi)\left(\frac{0.004}{10\sqrt{4.0}}\right) = 0.075\Omega$$

The ratio of the length of one side of the structure to spacing distance s is 10, thus each electrical resistance 28 should have a value of about 0.075 Ω·10=0.75 Ω.

Each impedance network 12 was represented by an equivalent electrical network 36 as shown in FIG. 5 including an electrical resistance 38 having a value of 0.75 ohms, an electrical inductance 40 having a value of 0.2 nanohenries, and an electrical capacitance 42 having a value of 1.0 microfarads. The value of resistance 38 is the sum of the resistance 28 and the electrical resistances of vias 32 and 34, inductance 40 is the electrical inductances of vias 32 and 34, and capacitance 42 is the selected value of capacitance 30.

Figure 9:
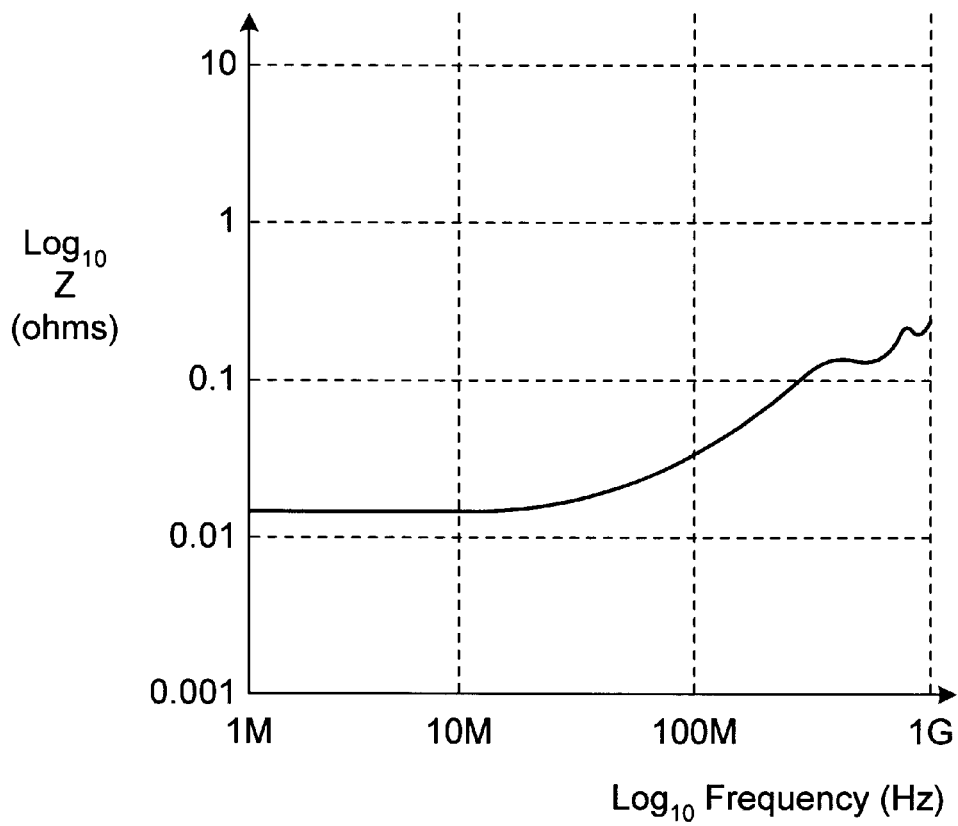
FIG. 9 is a graph of the logarithm of the simulated electrical impedance between the pair of conductive planes of the structure of FIG. 8 versus the logarithm of the frequency of a voltage between the planes.

FIG. 9 is a graph of the logarithm of the simulated electrical impedance Z between the pair of conductive planes of structure 48 of FIG. 8 versus the logarithm of the frequency of a voltage between the planes. The impedance value Z was computed by simulating the application of a 1 ampere constant current between the centers of the planes, varying the frequency of the current, and determining the magnitude of the steady state voltage between the centers of the rectangular planes. As shown in FIG. 9, the electrical impedance between the parallel conductive planes of FIG. 8 is nearly constant from 1 MHz to about 50 Mhz, and increases almost monotonically at frequencies above 50 MHz. The multiple electrical resonances of the conductive planes of FIG. 1 and evidenced at frequencies between 100 MHz and 1 GHz in FIG. 2 have been damped, resulting in the stabilizing of the impedance between the pair of conductive planes. As a result, the "edge terminated" parallel conductive planes of FIG. 8 would radiate a substantially smaller amount of EMI than the "unterminated" conductive planes of FIG. 1.

Figure 10:
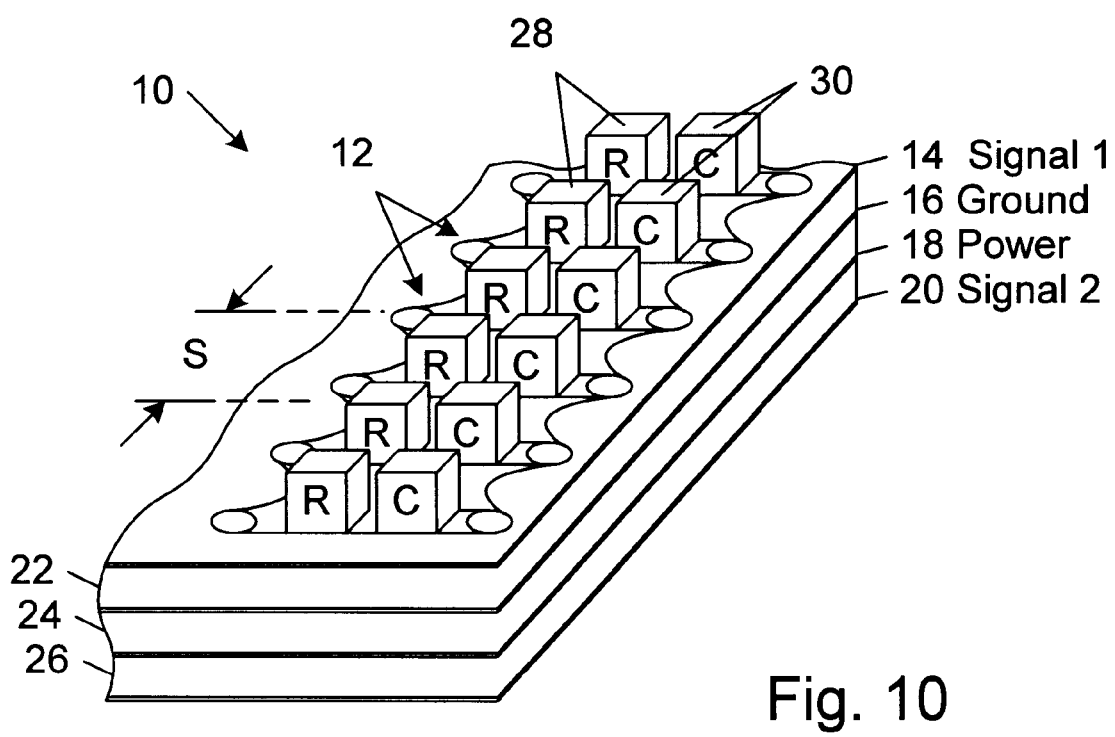
FIG. 10 is a perspective view of a portion of the interconnect apparatus of FIG. 3 wherein impedance networks are connected together to form a chain or "bar" of impedance networks.

FIG. 10 is a perspective view of a portion of interconnect apparatus 10 of FIGS. 3 and 4 wherein impedance networks 12 are connected together to form a chain or "bar" of impedance networks 12. Features of interconnect apparatus 10 appearing in FIGS. 3 and 4 and described above are labeled similarly in FIG. 10. Each impedance network 12 is a spaced distance s from adjacent impedance networks 12. The bar of impedance networks 12 may extend along the entire length of an edge of the upper surface of interconnect apparatus 10. A bar of impedance networks 12 may extend across each of the four edges of the upper surface of a rectangular interconnect apparatus 10.

Figure 11:
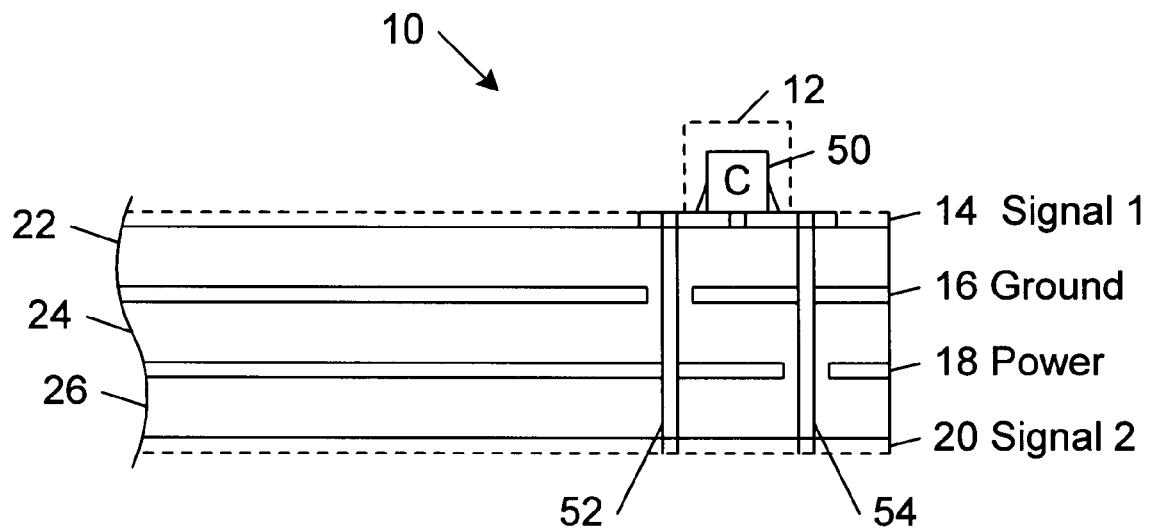
FIG. 11 is a cross sectional view of a portion of the interconnecting apparatus of FIG. 3 illustrating a second embodiment of the impedance networks, wherein each impedance network includes a capacitance, and wherein a resistance in series with the capacitance is the sum of the equivalent series resistance (ESR) of the capacitance and the resistances of the vias connecting the impedance network between the power and ground planes.

FIG. 11 is a cross sectional view of a portion interconnecting apparatus 10 of FIGS. 3 and 4 illustrating a second embodiment of impedance networks 12. Features of interconnect apparatus 10 appearing in FIGS. 3 and 4 and described above are labeled similarly in FIG. 11. In the embodiment of FIG. 11, each impedance network 12 includes a capacitance 50. A first via 52 connects power plane 18 to a first terminal of capacitance 50, and a second via 54 connects ground plane 16 to a second terminal of capacitance 50. Vias 52 and 54 may be, for example, plated-through holes formed using various well known techniques.

An electrical resistance substantially equal to the value of resistance 28 is incorporated in series with capacitance 50. For example, capacitance 50 may be selected such that it has an equivalent series resistance (ESR) substantially equal to the value of resistance 28. Alternately, vias 52 and 54 may be formed such that the sum of their resistances is substantially equal to the value of resistance 28. The resistances of vias 52 and 54 may be increased, for example, by reducing their cross sectional areas or by forming them from a material having a higher resistivity.

Figure 12:
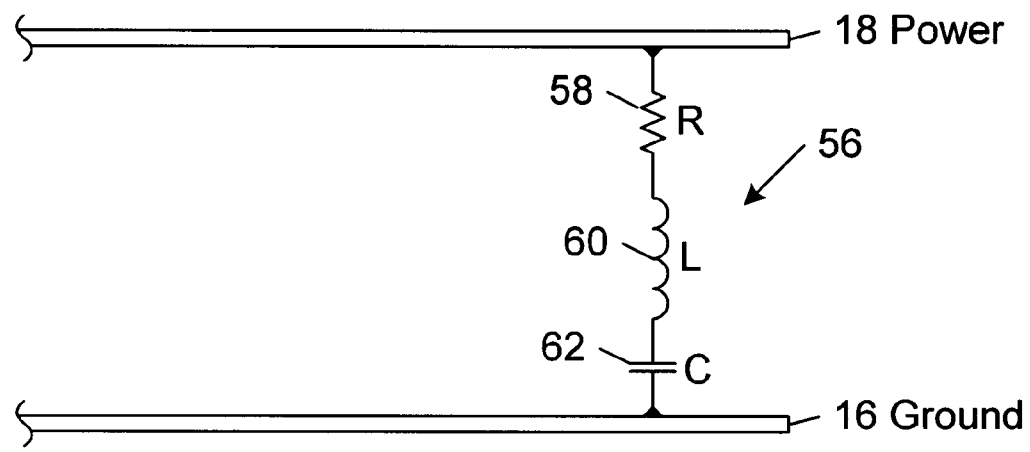
FIG. 12 is a circuit diagram showing an equivalent electrical network between the power and ground planes provided by the impedance network depicted in FIG. 11.

FIG. 12 is a circuit diagram showing an equivalent electrical network 56 between power plane 18 and ground plane 16 provided by the impedance network 12 depicted in FIG. 11. Electrical network 56 includes an electrical resistance (R) 58, an electrical inductance 60 (L), and an electrical capacitance (C) 62. The value of resistance 58 includes the ESR of capacitance 62 and the electrical resistances of vias 52 and 54. Inductance 60 includes the inductances of capacitor 50, via 52, and via 54. Capacitance 62 includes the value of capacitance 50.

Figure 13:
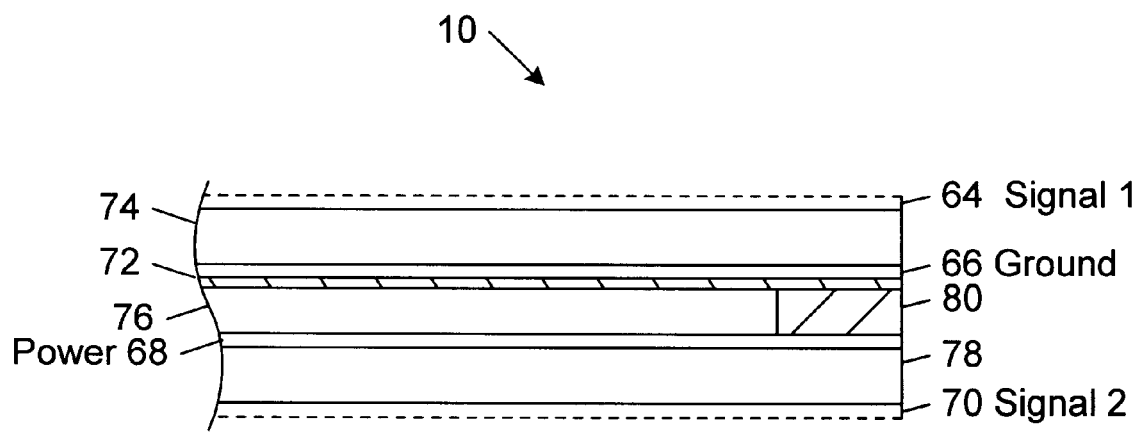
FIG. 13 is a cross sectional view of a portion the interconnecting apparatus of FIG. 3 illustrating an alternate method of forming an electrical resistance and capacitance in series between two conductive planes separated by a dielectric layer, wherein a resistive layer and an outer portion of the dielectric layer form a continuous (i.e., distributed) impedance network between regions of the conductive planes near peripheries.

FIG. 13 is a cross sectional view of a portion of interconnecting apparatus 10 illustrating an alternate method of forming an electrical resistance and capacitance in series between two conductive planes separated by a dielectric layer. The conductive planes may be, for example, connected to different d.c. potentials as are a power plane and a ground plane. In the embodiment of FIG. 13, the multiple impedance networks 12 of FIGS. 3–4 are replaced by a continuous (i.e., distributed) impedance network formed between regions of the conductive planes near peripheries.

In the embodiment of FIG. 13, interconnecting apparatus 10 includes four electrically conductive planes: a first signal plane 64, a ground plane 66, a power plane 68, and a second signal plane 70. A planar electrically resistive layer 72 is between ground plane 66 and power plane 68 and in contact with ground plane 66. First signal plane 64 and ground plane 66 are separated by a first dielectric layer 74. Resistive layer 72 and power plane 68 are separated by a second dielectric layer 76. Power plane 68 and second signal plane 70 are separated by a third dielectric layer 78.

A portion 80 around a region near the periphery of planar dielectric layer 76 has a higher relative dielectric constant than the relative dielectric constant of the remainder of dielectric layer 76. Portion 80 of dielectric layer 76 provides an electrical capacitance between power plane 68 and resistive layer 72. Resistive layer 72 provides a resistance between dielectric layer 76 and ground plane 66. The combination of portion 80 of dielectric layer 76 and resistive layer 72 between power plane 68 and ground plane 66 forms an electrical capacitance and an electrical resistance in series between power plane 68 and ground plane 66. The distributed impedance afforded by the series combination of the electrical capacitance and an electrical resistance is used to stabilize the electrical impedance between power plane 68 and ground plane 66.

Resistive layer 72 may include, for example, electrically conductive particulates (e.g., silver, copper, or nickel) suspended in a non-conductive binder (e.g., epoxy resin, urethane, or polyester). The resistivity of the particulate-binder combination may be varied by changing the number of conductive particulates per unit volume of the particulate-binder combination. Increasing the number of suspended conductive particulates per unit volume of the particulate-binder combination decreases the resistivity of the particulate-binder combination. Decreasing the number of suspended conductive particulates per unit volume of the particulate-binder combination increases the resistivity of the particulate-binder combination.

Resistive layer 72 is formed such that the electrical resistance between portion 80 of dielectric layer 76 and ground plane 66 along each edge of interconnect apparatus 10 is substantially equal to the characteristic impedance between power plane 68 and ground plane 66. For example, assume a structure including a pair of 10 in.×10 in. square planar conductors separated by a dielectric layer having a relative dielectric constant of 4.7 and a thickness or height h of 0.004 in. The characteristic impedance "Zo" of the structure is calculated as:

$$Z_o = Z_{oo}\left(\frac{h}{w\sqrt{\varepsilon_r}}\right) = (120\pi)\left(\frac{0.004}{10\sqrt{4.7}}\right) = 0.070\Omega$$

Accordingly, the electrical resistance between portion 80 of dielectric layer 76 and ground plane 66 along each edge of the structure is substantially equal to 0.070 Ω.

It is noted that planar resistive layer 72 may alternately be positioned between second dielectric layer 76 and power plane 68, and in contact with power plane 68. In yet another embodiment, a first and second resistive layers may be positioned between ground plane 66 and power plane 68. The first resistive layer may be located between second dielectric layer 76 and ground plane 66, and in contact with ground plane 66. The second resistive may be located between second dielectric layer 76 and power plane 68, and in contact with power plane 68.

The dielectric constant of portion 80 of dielectric layer 76 may be increased by suspending particulates of a substance having a relatively high dielectric constant (e.g., titanium dioxide or barium titanate) within a dielectric binder material (e.g., epoxy resin, polytetrafluoroethylene, or polystyrene). The dielectric constant of the particulate-binder combination may be varied by changing the number of particulates per unit volume of the particulate-binder combination. Increasing the number of suspended particulates per unit volume of the particulate-binder combination increases the dielectric constant of the particulate-binder combination. Decreasing the number of suspended particulates per unit volume of the particulate-binder combination decreases the dielectric constant of the particulate-binder combination.

Portion 80 of dielectric layer 76 is preferably formed such that the capacitance per unit length $C_l$ provided by portion 80 between power plane 68 and ground plane 66 along each outer edge of rectangular interconnect apparatus 10 is given by:

$$C_l > \frac{1}{2\pi \cdot R_l \cdot f_{res}}$$

where $R_l$ the resistance per unit length provided by resistive layer 72 and $f_{res}$ is the lowest resonant frequency of the structure including power plane 68, ground plane 66, and dielectric layer 76.

Figure 14:
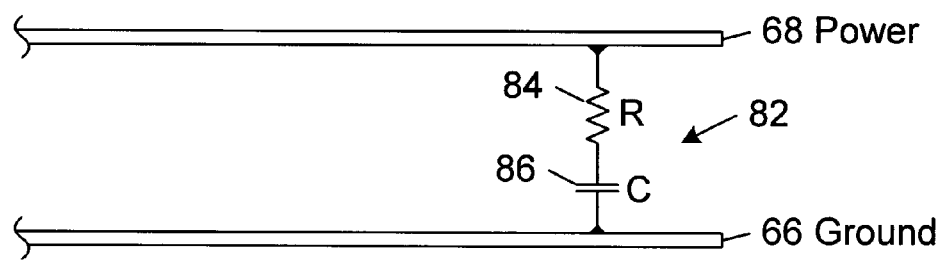
FIG. 14 is a circuit diagram showing an equivalent electrical network between the two conductive planes provided by the resistive layer and the outer portion of the dielectric layer as depicted in FIG. 13.

FIG. 14 is a circuit diagram showing an equivalent electrical network 82 between power plane 68 and ground plane 66 provided by portion 80 of dielectric layer 76 and resistive layer 72 as depicted in FIG. 13. Electrical network 82 includes an electrical resistance (R) 84 and an electrical capacitance (C) 86. The value of resistance 84 includes the resistance of resistive layer 72 offered between portion 80 of dielectric layer 76 and ground plane 66. Capacitance 86 includes the value of the capacitance offered by portion 80 of dielectric layer 76. The value and effects of any inductance in series with resistance 84 and capacitance 86 are believed negligible in the embodiment of FIG. 13.

Figure 15:
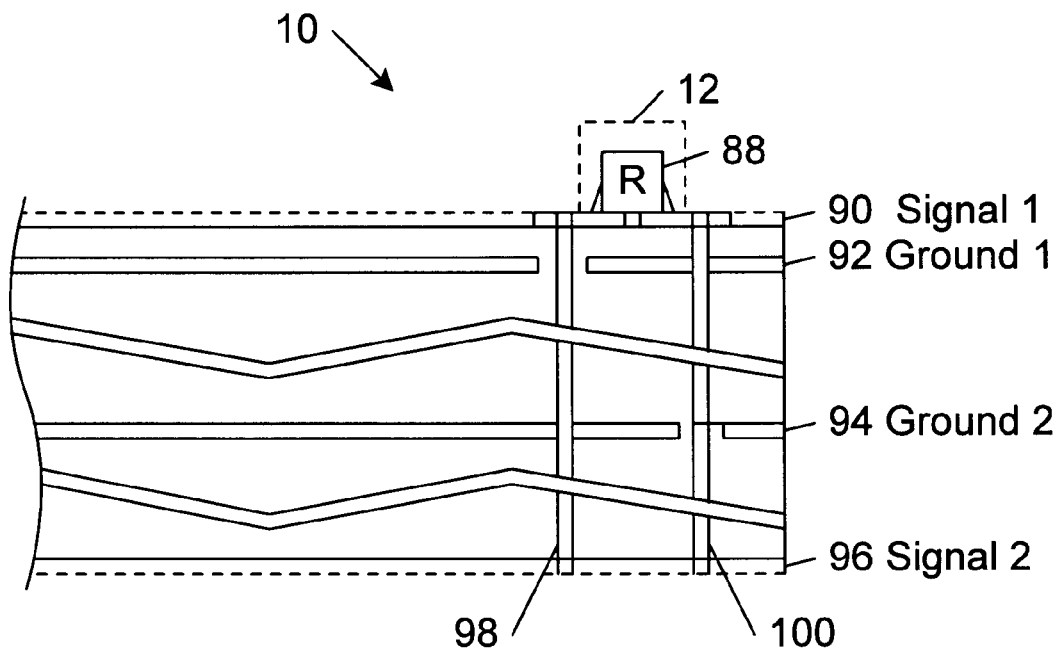
FIG. 15 is a cross sectional view of a portion the interconnecting apparatus of FIG. 3 illustrating another alternate embodiment of the impedance networks, wherein each impedance network includes only an electrical resistance connected between two ground planes.

FIG. 15 is a cross sectional view of a portion interconnecting apparatus 10 illustrating another alternate embodiment of impedance networks 12. In the embodiment of FIG. 15, impedance networks 12 are connected between a pair of planar conductors separated by at least one dielectric layer and connected to the same d.c. potential. The planar conductors may be, for example, two different ground planes. Each impedance network 12 includes an electrical resistance 88. The value of resistance 88 is determined in the same manner as described above for resistance 28. In the embodiment of FIG. 15, interconnecting apparatus 10 includes four electrically conductive planes: a first signal plane 90, a first ground plane 92, a second ground plane 94, and a second signal plane 96. A first via 98 connects second ground plane 94 to a first terminal of resistance 88, and a second via 100 connects first ground plane 92 to a second terminal of resistance 88. Vias 98 and 100 may be, for example, plated-through holes formed using various well known techniques.

Figure 16:
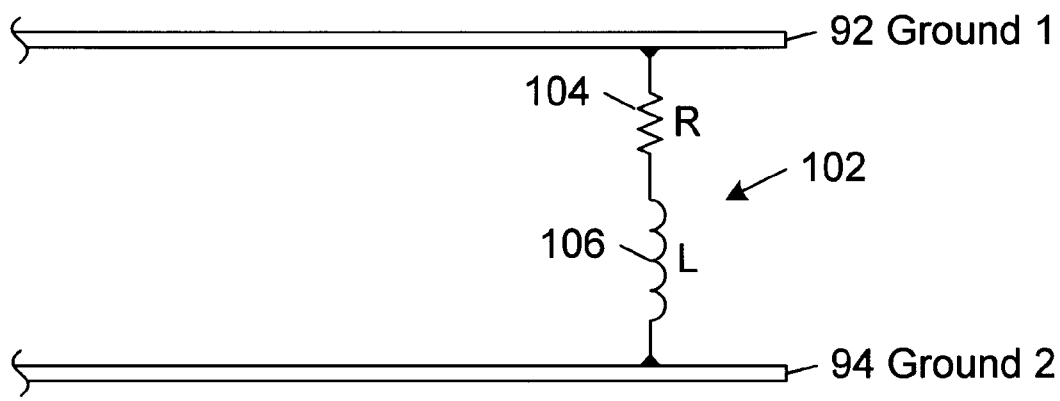
FIG. 16 is a circuit diagram showing an equivalent electrical network between the two ground planes provided by the impedance network depicted in FIG. 15.

FIG. 16 is a circuit diagram showing an equivalent electrical network 102 between first ground plane 92 and second ground plane 94 provided by the impedance network 12 depicted in FIG. 15. Electrical network 102 includes an electrical resistance (R) 104 and an electrical inductance (L) 106. The value of resistance 104 is substantially the sum of resistance 88 and the electrical resistances of vias 98 and 100. Inductance 106 is substantially the electrical inductances of vias 98 and 100.

Numerous variations and modifications will become apparent to those skilled in the art once the above disclosure is fully appreciated. It is intended that the following claims be interpreted to embrace all such variations and modifications.

What is claimed is:

1. A method for stabilizing the electrical impedance of a structure, comprising:

determining a characteristic impedance Zo of the structure, wherein the structure includes a pair of parallel planar conductors separated by a dielectric layer;

using the characteristic impedance Zo of the structure to calculate a value for each of at least three electrical resistances, wherein the respective value of each of the electrical resistances is greater than the characteristic impedance Zo of the structure; and electrically coupling the electrical resistances in parallel between the planar conductors along a side of the structure such that respective lateral spacings between the electrical resistances are maintained at a same distance therebetween.

2. The method as recited in claim 1, wherein the electrical resistances are discrete electrical resistances dispersed along an outer edge of the side of the structure.

3. The method as recited in claim 1, wherein the electrical resistances comprise n electrical resistances which are coupled between the planar conductors along the side of the structure, and wherein n≧3, and wherein each of the n electrical resistances has a value substantially equal to n·Zo.

4. The method as recited in claim 1, wherein the structure is square in shape and has four sides of equal length w, and wherein the characteristic impedance Zo of the structure is given by:

$$Z_o = Z_{oo}\left(\frac{h}{w\sqrt{\varepsilon_r}}\right),$$

and wherein Zoo is the impedance of free space, h is the distance between the planar conductors, and $\varepsilon_r$ is the relative dielectric constant of the dielectric layer.

5. An electrical interconnecting apparatus, comprising:

a pair of parallel planar electrical conductors separated by a dielectric layer, wherein each planar electrical conductor is substantially rectangular and has four sides, and wherein each planar electrical conductor has an outer region near the four sides; and a plurality of impedance networks electrically connected between the outer regions of the planar conductors, wherein each impedance network includes a resistive electrical resistance in series with a respective electrical capacitance, and wherein n of the impedance networks reside along one side of the electrical interconnecting apparatus, and wherein n≧3, and wherein the respective electrical resistance of each of the n impedance networks has a corresponding value greater than a characteristic impedance of the planar conductors, and wherein the n impedance networks are separated from each other by the same lateral spacing distance therebetween.

6. A method for stabilizing the electrical impedance of a substantially rectangular structure including a pair of parallel planar conductors separated by a dielectric layer, the method comprising:

selecting a value for each of n electrical resistances, wherein n≧3, and wherein the respective value of each of the n electrical resistances is greater than a characteristic impedance of the structure; and electrically coupling the n electrical resistances between the planar conductors along an outer edge of a side of the structure, wherein the coupling is performed such that respective lateral spacings between the electrical resistances are maintained at a same distance therebetween.

7. The method as recited in claim 6, wherein the structure is square in shape and has four sides of equal length, and wherein the selecting step comprises:

determining the characteristic impedance of the structure;

computing the same spacing distance between the electrical resistances; and multiplying the characteristic impedance of the structure by the ratio of the length of the sides of the structure to the spacing distance.

8. The method as recited in claim 6, wherein the selecting step comprises:

determining the same spacing distance between the electrical resistances; and computing a characteristic impedance of a square portion of the structure having four sides, wherein the length of each side is equal to the spacing distance.

9. An electrical interconnecting apparatus, comprising:

a pair of parallel planar electrical conductors separated by a dielectric layer, wherein each planar electrical conductor is substantially rectangular and has four sides, and wherein each planar electrical conductor has an outer region near the four sides; and a plurality of impedance networks electrically connected between the outer regions of the planar conductors, wherein each impedance network includes a respective electrical resistor, and wherein n of the impedance networks reside along one side of the electrical interconnecting apparatus, and wherein n≧3, and wherein the respective electrical resistor of each of the n impedance networks has a corresponding value greater than a characteristic impedance of the planar conductors, and wherein the n impedance networks are separated from each other by the same lateral spacing distance therebetween.

10. The electrical interconnecting apparatus as recited in claim 9, wherein each impedance network is located upon an upper surface of the electrical interconnecting apparatus, and wherein a pair of vias is used to connect each impedance network between the outer regions of the planar conductors.

11. The electrical interconnecting apparatus as recited in claim 9, wherein each of the planar conductors is continuous over at least a portion of the electrical interconnecting apparatus.

12. The electrical interconnecting apparatus as recited in claim 9, wherein signals are conveyed within the electrical interconnecting apparatus, and wherein the signals have an associated frequency range, and wherein the spacing distance between the impedance networks is equal to a fraction of the wavelength of the highest frequency in the frequency range.

13. The electrical interconnecting apparatus as recited in claim 12, wherein the electrical interconnecting apparatus further comprises a signal layer separate from the pair of parallel planar electrical conductors, and wherein the signal layer includes traces for conveying the signals.

14. The electrical interconnecting apparatus as recited in claim 12, wherein the spacing distance between the impedance networks is less than or equal to one tenth of the wavelength of the highest frequency in the frequency range.

15. The electrical interconnecting apparatus as recited in claim 9, wherein the pair of planar conductors are adapted for coupling to different power supply potentials.

16. The electrical interconnecting apparatus as recited in claim 9, wherein the pair of planar conductors are adapted for coupling to the same power supply potential.

17. The electrical interconnecting apparatus as recited in claim 9, wherein the n impedance networks are connected together to provide a chain of impedance networks.

18. The electrical interconnecting apparatus as recited in claim 9, wherein each impedance network further comprises an electrical capacitor in series with the electrical resistor.

19. The electrical interconnecting apparatus as recited in claim 9, wherein the electrical interconnecting apparatus is a printed circuit board.

20. The electrical interconnecting apparatus as recited in claim 9, wherein the dielectric layer is a fiberglass-epoxy composite.

21. A method for stabilizing the electrical impedance of a structure, comprising:

- determining a characteristic impedance Zo of the structure, wherein the structure includes a pair of parallel planar electrical conductors separated by a dielectric layer, and wherein each planar electrical conductor is substantially rectangular and has four sides, and wherein a distance between opposite sides of one of the planar conductors is substantially equal to a corresponding distance between opposite sides of the other planar conductor, and wherein each planar electrical conductor has an outer region near the four sides; and
- forming a continuous electrical resistance between the outer regions of the planar conductors along an outer edge of one of the four sides of the structure, wherein the continuous electrical resistance offers an electrical resistance substantially equal to Zo.

22. The method as recited in claim 21, further comprising:

- forming a continuous electrical capacitance between the planar conductors along the outer edge of the side of the structure, wherein the continuous electrical capacitance is in series with the continuous electrical resistance, and wherein the continuous electrical capacitance offers an electrical capacitance dependent upon a resonant frequency the structure.

23. An electrical interconnecting apparatus, comprising:

- a pair of parallel planar electrical conductors separated by a dielectric layer, wherein each planar electrical conductor is substantially rectangular and has four sides, and wherein a distance between opposite sides of one of the planar conductors is substantially equal to a corresponding distance between opposite sides of the other planar conductor, and wherein each planar electrical conductor has an outer region near the four sides; and
- a continuous electrical resistance electrically coupled between the outer regions of the planar conductors, wherein a portion of the continuous electrical resistance exists between the planar conductors along a outer edge of one of the four sides of the structure, and wherein the portion of the continuous electrical resistance offers an electrical resistance substantially equal to a characteristic impedance of the planar conductors.

24. The electrical interconnecting apparatus as recited in claim 23, wherein the electrical resistance comprises a planar electrically resistive layer.

25. The electrical interconnecting apparatus as recited in claim 24, wherein the electrically resistive layer is positioned between the dielectric layer and one of the planar conductors, and wherein the electrically resistive layer is in contact with the one of the planar conductors.

26. The electrical interconnecting apparatus as recited in claim 25, wherein the dielectric layer is substantially rectangular and has four sides, and wherein the dielectric layer includes an inner portion and an outer portion, and wherein the outer portion is located between regions of the planar conductors near the four sides of the dielectric layer, and wherein the dielectric constant of the outer portion of the dielectric layer is greater than the dielectric constant of the inner portion of the dielectric layer.

27. The electrical interconnecting apparatus as recited in claim 26, wherein the outer portion of the dielectric layer provides an electrical capacitance near a periphery of the dielectric layer, and wherein the electrical capacitance has a value inversely related to a value of the electrical resistance.

* * * * *

UNITED STATES PATENT AND TRADEMARK OFFICE
CERTIFICATE OF CORRECTION

PATENT NO. : 6,104,258
DATED : August 15, 2000
INVENTOR(S) : Istvan Novak

Page 1 of 1

It is certified that error appears in the above-identified patent and that said Letters Patent is hereby corrected as shown below:

Claims

Column 15,
Line 51, please change "resistive" to "respective".
Line 52, please change "respective" to "corresponding".

Signed and Sealed this

Seventh Day of August, 2001

Attest:

NICHOLAS P. GODICI
Attesting Officer
Acting Director of the United States Patent and Trademark Office